(12) United States Patent
Hsiu

(10) Patent No.: US 8,879,251 B2
(45) Date of Patent: Nov. 4, 2014

(54) PORTABLE ELECTRONIC DEVICE

(71) Applicant: Wistron Corporation, New Taipei (TW)

(72) Inventor: Cheng-Min Hsiu, New Taipei (TW)

(73) Assignee: Wistron Corporation, New Taipei (TW)

( * ) Notice: Subject to any disclaimer, the term of this patent is extended or adjusted under 35 U.S.C. 154(b) by 233 days.

(21) Appl. No.: 13/677,385

(22) Filed: Nov. 15, 2012

(65) Prior Publication Data

US 2013/0229753 A1 Sep. 5, 2013

(30) Foreign Application Priority Data

Mar. 3, 2012 (TW) .............................. 101203828 A

(51) Int. Cl.
*G06F 1/16* (2006.01)
*H05K 5/03* (2006.01)

(52) U.S. Cl.
CPC ........ *H05K 5/03* (2013.01); *G06F 1/166* (2013.01); *G06F 1/1681* (2013.01)
USPC .................................................... 361/679.59

(58) Field of Classification Search
USPC ........................................ 361/679.55, 679.59
See application file for complete search history.

(56) References Cited

U.S. PATENT DOCUMENTS

| | | | | |
|---|---|---|---|---|
| 5,818,688 A * | 10/1998 | Gluskoter et al. | ....... | 361/679.09 |
| 6,053,589 A * | 4/2000 | Lin | ............................... | 312/271 |
| 6,097,592 A * | 8/2000 | Seo et al. | ................. | 361/679.55 |
| 7,679,905 B2 * | 3/2010 | Wu et al. | .................. | 361/679.59 |
| 7,697,283 B2 * | 4/2010 | Mathew et al. | .......... | 361/679.59 |
| 7,746,636 B2 * | 6/2010 | Tang | ......................... | 361/679.55 |
| 7,898,802 B2 * | 3/2011 | Lian | ......................... | 361/679.59 |
| 7,986,525 B2 * | 7/2011 | Wang | ....................... | 361/679.59 |
| 7,990,703 B2 * | 8/2011 | Tang | ......................... | 361/679.59 |
| 8,050,032 B2 * | 11/2011 | Trang | ....................... | 361/679.59 |
| 8,139,357 B2 * | 3/2012 | Trang | ....................... | 361/679.59 |
| 8,199,498 B2 * | 6/2012 | Wang et al. | .............. | 361/679.59 |
| 8,213,177 B2 * | 7/2012 | Uttermann et al. | ...... | 361/679.59 |
| 8,218,313 B2 * | 7/2012 | Cheng et al. | ............. | 361/679.48 |
| 8,264,839 B2 * | 9/2012 | Shen et al. | ............... | 361/679.59 |
| 8,531,837 B2 * | 9/2013 | Lee et al. | ................. | 361/679.59 |
| 8,763,501 B2 * | 7/2014 | Cheng et al. | .................... | 81/489 |
| 2010/0315773 A1 * | 12/2010 | Senatori | ................... | 361/679.55 |
| 2011/0222233 A1 * | 9/2011 | Lu et al. | .................... | 361/679.21 |
| 2011/0292605 A1 * | 12/2011 | Chen et al. | .................... | 361/695 |
| 2013/0075550 A1 * | 3/2013 | Chiu et al. | ................. | 248/188.9 |

* cited by examiner

*Primary Examiner* — Lisa Lea Edmonds
(74) *Attorney, Agent, or Firm* — Shook Hardy & Bacon LLP

(57) ABSTRACT

A portable electronic device includes a housing body having a bottom wall and a pair of grooves formed in the bottom wall, a cover body, a pair of hinges interconnecting the housing and cover bodies, a pair of foot modules respectively corresponding to positions of the grooves, and a pair of cam mechanisms each connected to one hinge and an adjacent foot module. Each foot module includes a foot pad movable between retracted and protruding position. When the cover body is pivoted from a closed position to an open position, each hinge actuates a respective cam mechanism which in turn actuates the foot pad to move the latter from the retracted to the protruding position.

10 Claims, 10 Drawing Sheets

PORTABLE ELECTRONIC DEVICE

CROSS-REFERENCE TO RELATED APPLICATION

This application claims priority of Taiwanese Patent Application No. 101203828, filed on Mar. 3, 2012, the disclosure of which is incorporated herein by reference.

BACKGROUND OF THE INVENTION

The invention relates to an electronic device, and more particularly to a portable electronic device having movable foot pads.

Referring to FIGS. 1 and 2, as the thickness of a notebook computer 9 gradually decreases, when the notebook computer 9 is placed on a desktop 90, a socket connector 92, such as a USB socket or a VGA socket, that is disposed on a periphery of a housing body 91 of the notebook computer 9 becomes close to the desktop 90. When a plug connector 93 is connected to the socket connector 92, the plug connector 93 protrudes out of a bottom surface 911 (FIG. 2) of the housing body 91 and in contact with the desktop 90. As a result, a user cannot easily insert or remove the plug connector 93 into or from the socket connector 92 due to interference with the desktop 90.

Thus, how to enable the user of the thin notebook 93 into or from the note book computer 9 is a problem to be resolved.

SUMMARY OF THE INVENTION

Therefore, an object of the present invention is to provide a portable electronic device having a housing that includes a housing body, a cover body and a pair of foot pads. The housing body is provided with a socket connector. The foot pads may protrude out of the housing body as the cover body is opened to increase the distance between the socket connector and a desktop.

According to one embodiment of this invention, a portable electronic device is provided. The portable electronic device includes a housing, a pair of foot modules and a pair of cam mechanisms. The housing includes a housing body, a cover body and a pair of hinges interconnecting the housing body and the cover body so that the cover body is pivotable relative to the housing body between a closed position and an open position. The housing body has a bottom wall and a pair of grooves formed in the bottom wall. Each of the pair of grooves is spaced apart from a respective one of the hinges by a definite distance. The foot modules are disposed on the bottom wall and respectively correspond to positions of the pair of grooves. Each of the foot modules includes a hollow limiting member and a foot pad. An inner portion of the limiting member is in grooves. The foot pad is movably disposed in the limiting member and the respective groove, and is movable between a retracted position, where the foot pad is disposed in the limiting member and the respective groove, and a protruding position, where the foot pad partially protrudes out of the respective groove. Each of the cam mechanisms is connected to one of the hinges and an adjacent one of the foot modules. When the cover body is pivoted from the closed position to the open position, each of the hinges actuates a respective one of the cam mechanisms which in turn actuates the foot pad of a respective one of the foot modules so as to move the foot pad from the retracted position to the protruding position.

The efficiency of the present invention resides in that because the foot pads can be moved from the retracted position to the protruding position as the cover body is opened pivotally, the distance between a socket connector that is disposed on the housing body and a desktop can be increased, thereby facilitating insertion or removal of the plug connector into or from the socket connector.

BRIEF DESCRIPTION OF THE DRAWINGS

Other features and advantages of the present invention will become apparent in the following detailed description of one embodiment with reference to the accompanying drawings, of which.

DETAILED DESCRIPTION OF THE PREFERRED EMBODIMENT

The above-mentioned and other technical contents, features, and effects of this invention will be clearly presented from the following detailed description of an embodiment in coordination with the reference drawings.

Figure 1:
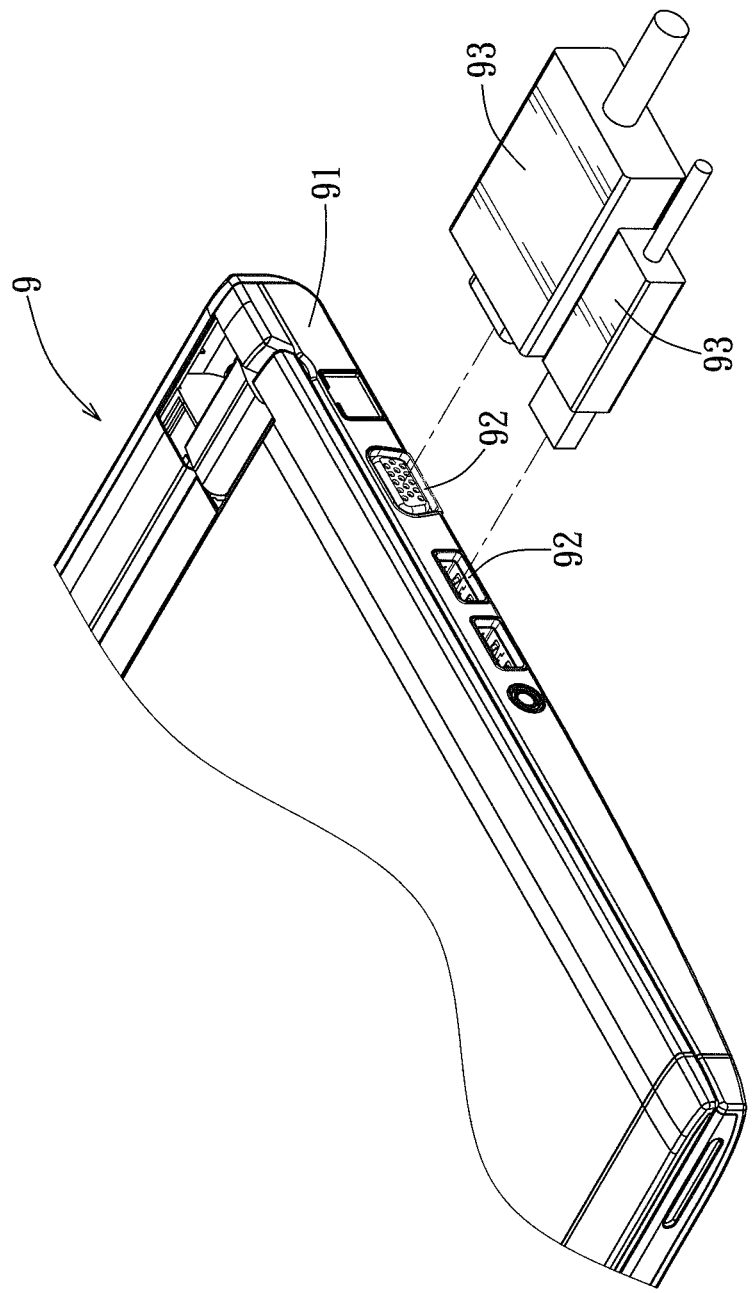
FIG. 1 is a fragmentary exploded perspective view of a conventional note book computer and plug connectors.
Figure 2:
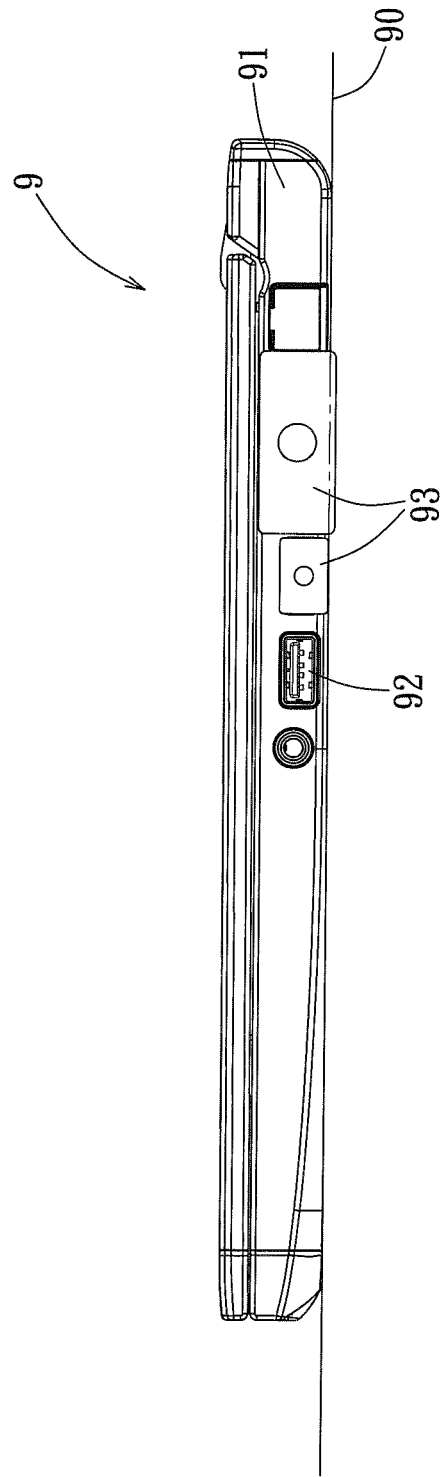
FIG. 2 is a schematic side view of FIG. 1 with the plug connectors connected to the conventional note book computer.
Figure 3:
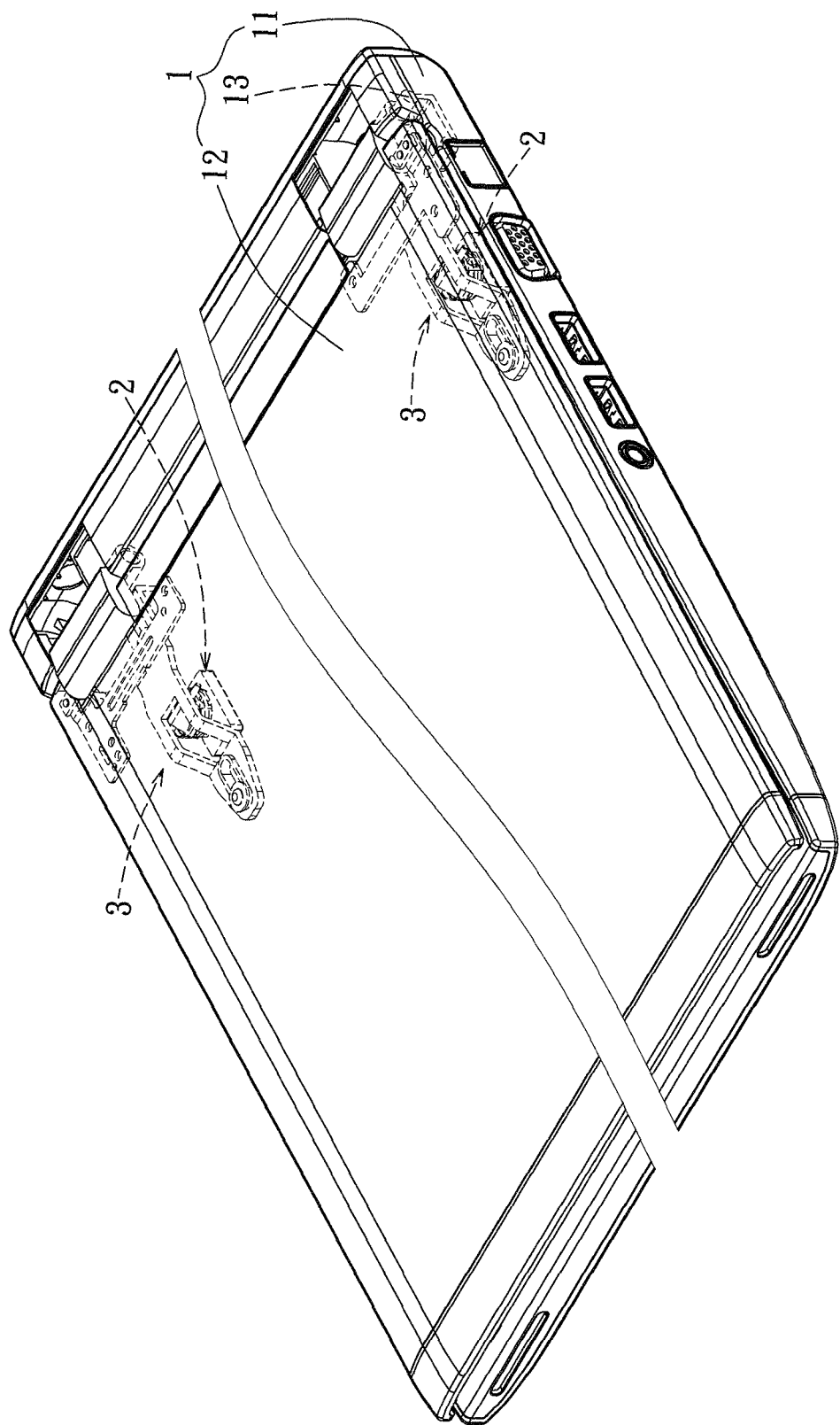
FIG. 3 is a fragmentary perspective view of a portable electronic device according to an embodiment of the present invention.
Figure 4:
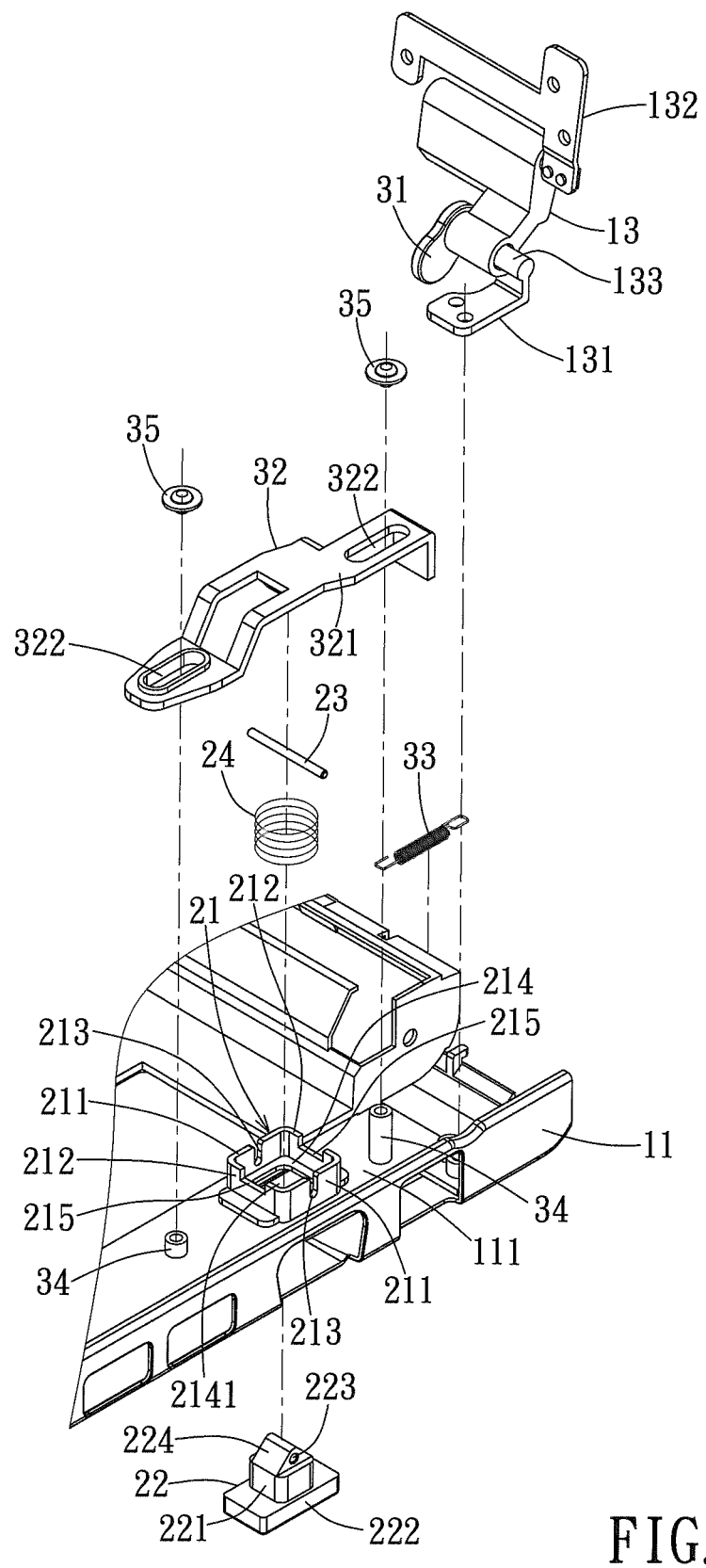
FIG. 4 is an enlarged fragmentary exploded perspective view of the embodiment.
Figure 5:
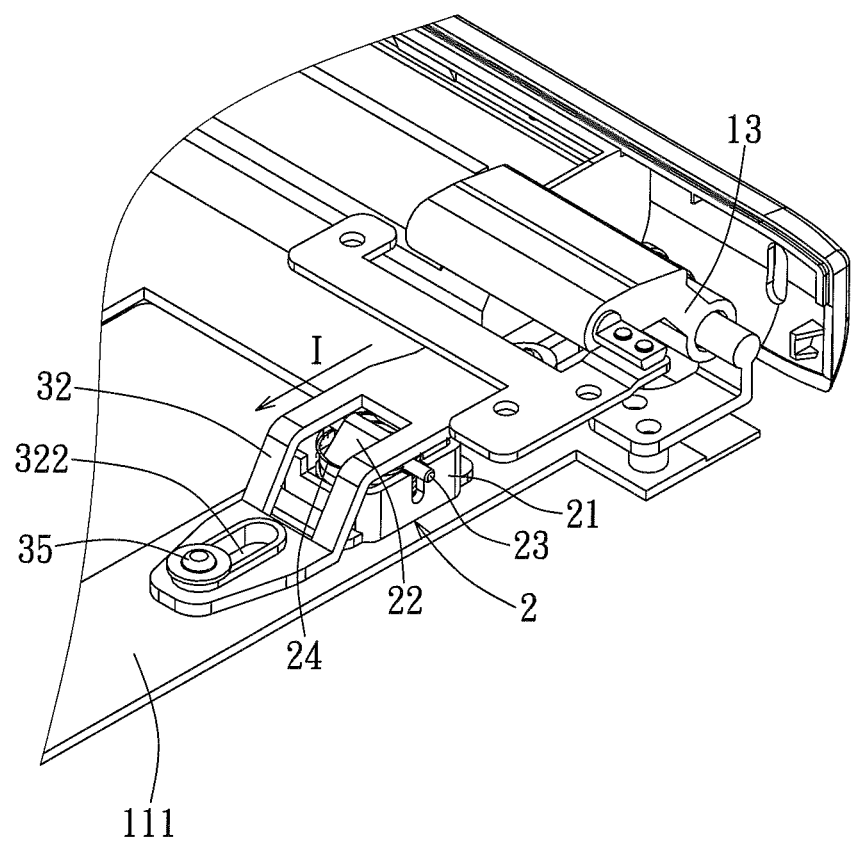
FIG. 5 is an enlarged fragmentary perspective view of the embodiment in an assembled state.

Referring to FIG. 3, a portable electronic device according to an embodiment of the present invention is exemplified as a note book computer, and includes a housing 1, a pair of foot modules 2 and a pair of cam mechanisms 3. In this embodiment, the pair of the foot modules 2, as well as the pair of the cam mechanisms 3, are symmetrically disposed at left and right sides of the housing body 11, respectively.

Referring to FIGS. 3 to 6, the housing 1 includes a housing body 11, a cover body 12 and a pair of hinges 13. The pair of hinges 13 are respectively disposed at left and right sides of the housing body 11 and interconnect the housing body 11 and the cover body 12, so that the cover body 12 is pivotable relative to the housing body 11 between a closed position shown in FIG. 3 and an open position shown in FIG. 10. The housing body 11 has a bottom wall 111 and a pair of grooves 112 (only one is shown) respectively formed in left and right bottom sides of the bottom wall 111. Each of the grooves 112 is spaced apart from a respective one of 13 includes a first hinge leaf 131 fixed to a top side of the bottom wall 111, a second hinge leaf 132 fixed to the cover body 12, and a hinge pin 133 interconnecting the first and second hinge leaves 131, 132.

The foot modules 2 are respectively disposed on left and right top sides of the bottom wall 111 and are respectively corresponding to positions of the grooves 112. Each of the foot modules 2 includes a hollow limiting member 21, a foot pad 22, a limiting rod 23, and a first elastic element 24.

The limiting member 21 includes a pair of first vertical walls 211, a pair of second vertical walls 212, a pair of vertical guide slots 213, and a holding portion 214. The first vertical walls 211 are oppositely spaced apart from each other in a left-right direction and are perpendicular to the bottom wall 111. The second vertical walls 212 are connected between the first vertical walls 211 and cooperate with the same to define a surrounding wall. The vertical guide slots 213 extend inwardly and respectively from top ends of the first vertical walls 211 to receive respectively therein two opposite ends of the limiting rod 23, so that the limiting rod 23 is movable in the vertical guide slots 213 along a direction perpendicular to the bottom wall 111. The holding portion 214 can be annular and is adjacent to the respective groove 112. The holding walls 211, 212, and defines a hole 2141 that spatially communicates an inner portion of the limiting member 21 with the respective groove 112. The limiting member 21 may be formed integrally as one piece with the bottom wall 111, or may be fabricated separately and then assembled to the bottom wall 111, and is not limited thereto.

Figure 6:
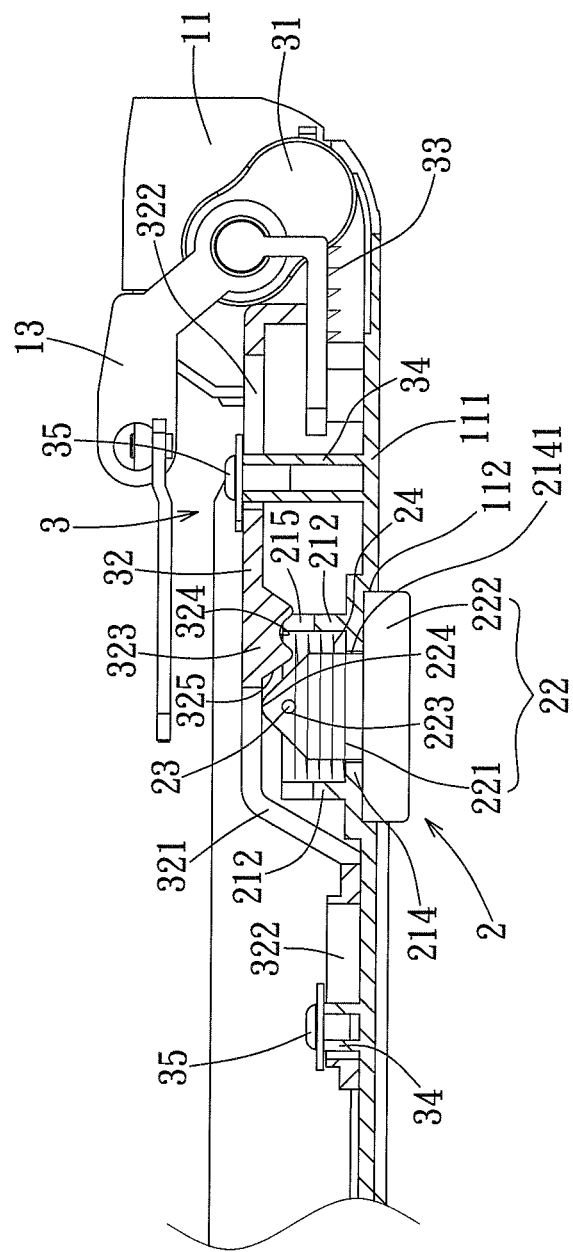
FIG. 6 is an enlarged fragmentary sectional view of the embodiment, illustrating a foot pad in a retracted position.
Figure 8:
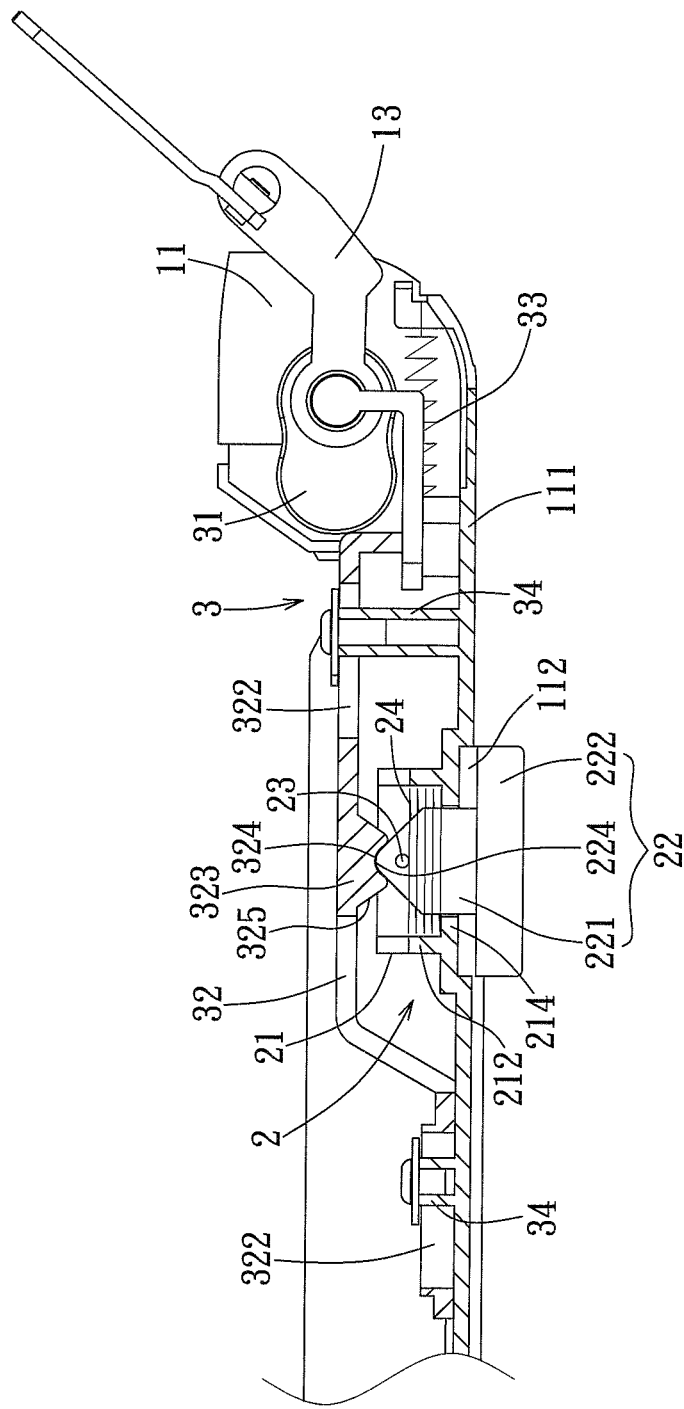
FIG. 8 is a view similar to FIG. 6, but illustrating the foot pad in a protruding position.

The foot pad 22 is movably disposed in the limiting member 21 and the respective groove 112, and has a foot pad body 221, a bottom plate 222 connected to a bottom side of the foot pad body 221, and a through slot 223 formed in a top side of the foot pad body 221 to receive therein a rod body of the limiting rod 23 which is between the two opposite ends of the limiting rod 23. The foot pad 22 is movable between a retracted position, as shown in FIG. 6, and a protruding position, as shown in FIG. 8. With reference to FIG. 6, when the foot pad 22 is in the retracted position, the foot pad body 221 is received in the inner portion of the limiting member 21, while the bottom plate 222 is received partially in the groove 112 and abuts against the holding portion 214. With reference to FIG. 8, when the foot pad 22 is in the protruding position, the foot pad body 221 partially protrudes out of the groove 112, and the bottom plate 222 is distally spaced apart from the holding portion 214.

As shown in FIG. 6, the first elastic element 24 is disposed around the foot pad body 221 and is sandwiched between the limiting rod 23 and the holding portion 214. The first elastic element 24 is a spring in this embodiment. Since the limiting rod 23 extends through the foot pad body 221 so as to be movable along with the foot pad 22, when the foot pad 22 is moved from the retracted position to the protruding position through a pushing action of a respective one of the cam mechanisms 3 (to be detailed below), the limiting rod 23 moves towards the holding portion 214 and compresses the first elastic element 24, as shown in FIG. 8. When pressing of the foot pad 22 is released, through a restoring force of the first elastic element 24, the limiting rod 23 is biased by the first spring element 24 to move away from the holding portion 214. The limiting rod 23, in turn, pulls the foot pad 22 back to the retracted position.

Each of the cam mechanisms 3 is connected to one of the hinges 13 and an adjacent one of the foot modules 2. Each of the cam mechanisms 3 includes a cam 31, a cam follower 32 and a second elastic element 33. The cam follower 32 is configured to linearly reciprocate along the top side of the bottom wall 111 under the action of the cam 31 and the second elastic element 33. Specifically, the cam 31 is coupled to the hinge pin 133, and the cam follower 32 is mounted on the top side elongated body 321, a pair of elongated slide slots 322 formed in the elongated body 321, and a push portion 323 (see FIG. 6) extending from a bottom side of the elongated body 321 and corresponding in position to the foot pad 22. The elongated body 321 spans a respective one of the foot modules 2. The slide slots 322 are respectively located at front and rear sides of the push portion 323 and extend along a moving direction (I) of the cam follower 32 along a moving direction (I) of the cam follower 32 to receive respectively two fixing studs 34 that are connected to the top side of the bottom wall 111 and that are disposed on front and rear sides of a corresponding groove 112. Screws 35 are then engaged threadedly and respectively to the fixing studs 34, thereby restricting movement of the cam follower 32 on the top side of the bottom wall 111 along the moving direction (I). In this embodiment, the foot pad body 221 has a first positioning structure 224 formed on the top side thereof. The first positioning structure 224 is configured as an inverted V-shaped protrusion. The through slot 223 is formed in the first positioning structure 224. The push portion 323 has a second positioning structure 324 which includes a guide inclined face 325, and a substantially inverted V-shaped groove 324 that is formed rearwardly of the guide inclined face 325 and that is configured to the first positioning structure 224. The guide inclined face 325 is slidable on the first positioning structure 224 when the cam follower 32 moves forwardly.

Further, the second vertical walls 212 of the limiting member 21 are spaced apart from each other in the moving direction (I) of the cam follower 32, and are respectively formed with a notch 215 to permit passage of the push portion 323 into or out of the inner portion of the limiting member 21 when the cam follower 32 moves in the moving direction (I). In this embodiment, the second elastic element 33 can be a tension spring, and has one end fixed to a rear side the housing body 11 and the other end fixed to the elongated body 321 of the cam follower 32.

Figure 7:
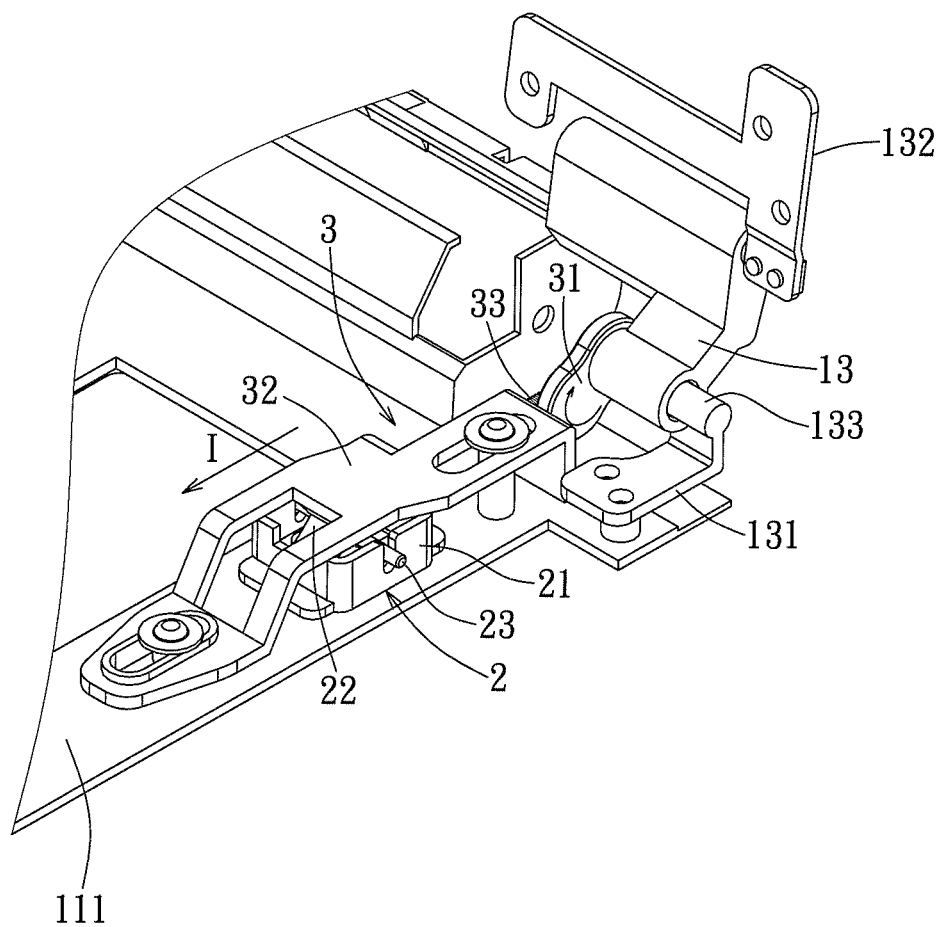
FIG. 7 is a view similar to FIG. 5, but illustrating how a cam pushes a cam follower when a hinge leaf rotates upwardly.

Referring to FIGS. 7 and 8, in combination with FIG. 3, when the cover body 12 is pivoted from the closed position (see FIG. 3) to the open position (see FIG. 10), the second hinge leaf 132 of the hinge 13 rotates along with the cover body 12 and simultaneously actuates the cam 31 to move close to the cam follower 32. The cam 31 pivots in a direction similar to that of the cover body 12. As the cover body 12 reaches a certain pivot angle, the cam 31 pushes the cam follower 32 to slide in a direction away from the hinge 13, so that the push portion 323 is in contact with the first positioning structure 224. Through the guide inclined face 325, the first positioning structure 224, so that the second positioning structure 324 can engage with the first positioning structure 224. Simultaneously, the push portion 323 presses the foot pad 22 to move the foot pad 22 from the retracted position to the protruding position. In this embodiment, the moving stroke of the cam mechanism 3 is controlled in cooperation with the pivot angle of the cover body 12, so that when the cover body 12 is pivoted to a pivot angle of 130° relative to the housing body 11, the second positioning structure 324 and the first positioning structure 224 are just engaged with each other. Through this, the cover body 12 can be positioned at the pivot angle of 130° relative to the housing body 11, thereby facilitating a user to view a display screen (not shown) disposed on the cover body 12.

Figure 9:
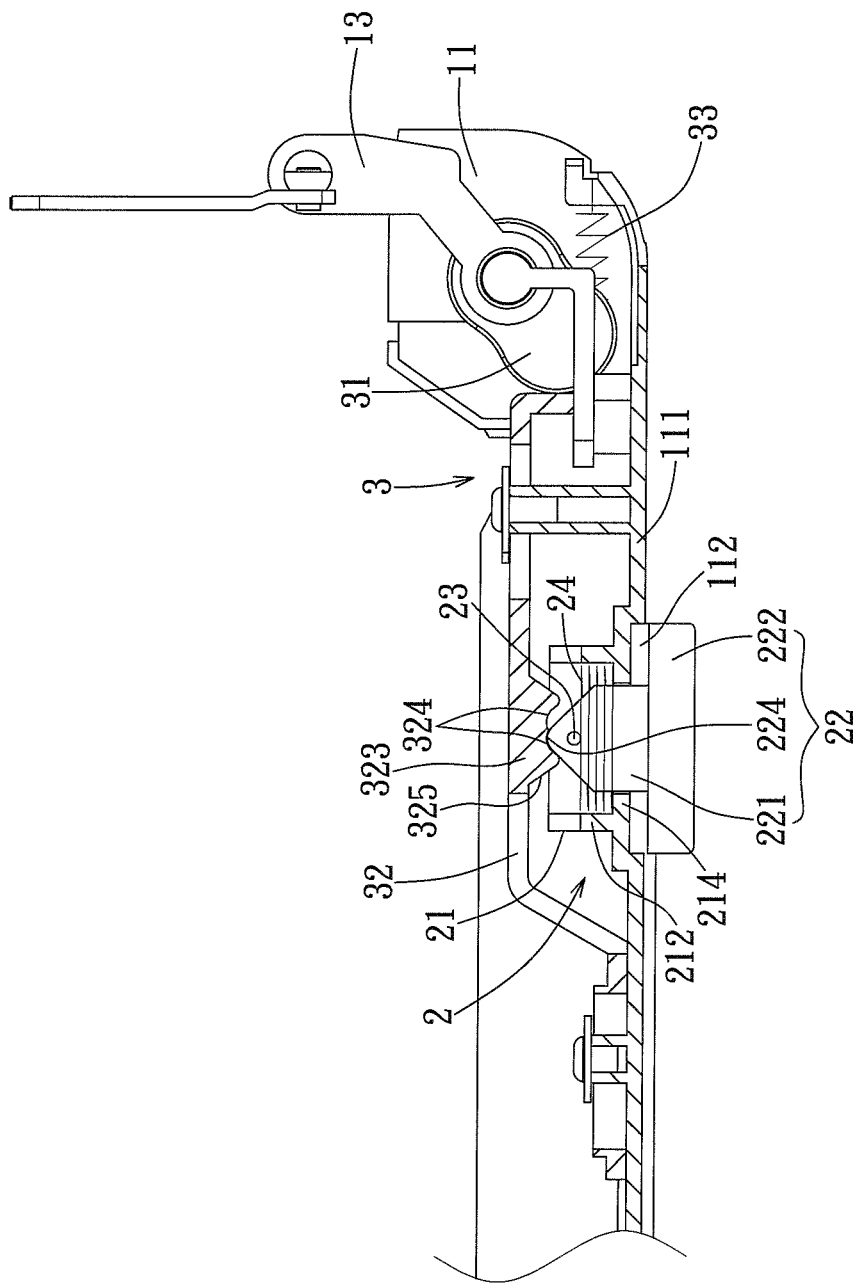
FIG. 9i is a view similar to FIG. 8, but illustrating an alternative form of a cam mechanism of the embodiment.

Similarly, referring to FIG. 9, in an alternative embodiment, the second positioning structure 324 may include a plurality of interconnected substantially inverted V-shaped grooves 324. The grooves 324 are arranged along the moving direction (I) of the cam follower 32. When the first positioning structure 224 is engaged to one of the grooves 324, the cover body 12 can be positioned at a predetermined pivot angle relative to the housing body 11. That is, the cover body 12 may be selectively positioned at a desired pivot with a selected one of the grooves 324. Moreover, when the cam follower 32 is driven by the cam 31 to shied in the direction away from the hinge 13, the cam follower 32 simultaneously pulls the second elastic element 33 to stretch the same.

When the cover body 12 is pivoted downwardly back to the closed position, the cam 31 is pivoted in the same direction as the cover body 12 to gradually move away from the cam follower 32. Simultaneously, the cam follower 32 is restored to its original position through a restoring force of the second elastic element 33, and the push portion 323 is moved away from the foot pad 22 so as to disengage from the same and to release its pressing on the foot pad 22. At this time, the foot pad 22 is biased by the restoring force of the first elastic element 24 to move from the protruding position to the retracted position.

In this embodiment, the foot module 2 is provided with the first elastic element 24 so that the foot pad 22 may be restored to the retracted position when the cover body 12 is closed. Alternatively, the foot module 2 may be dispensed with the first elastic element 24. In this case, when the push portion 323 is disengaged from the foot pad 22, the foot pad 22, which is located on a desktop 90 (see FIG. 10) without supporting the housing body 11, can be pressed by the desktop 90 to restore to the retracted position.

Figure 10:
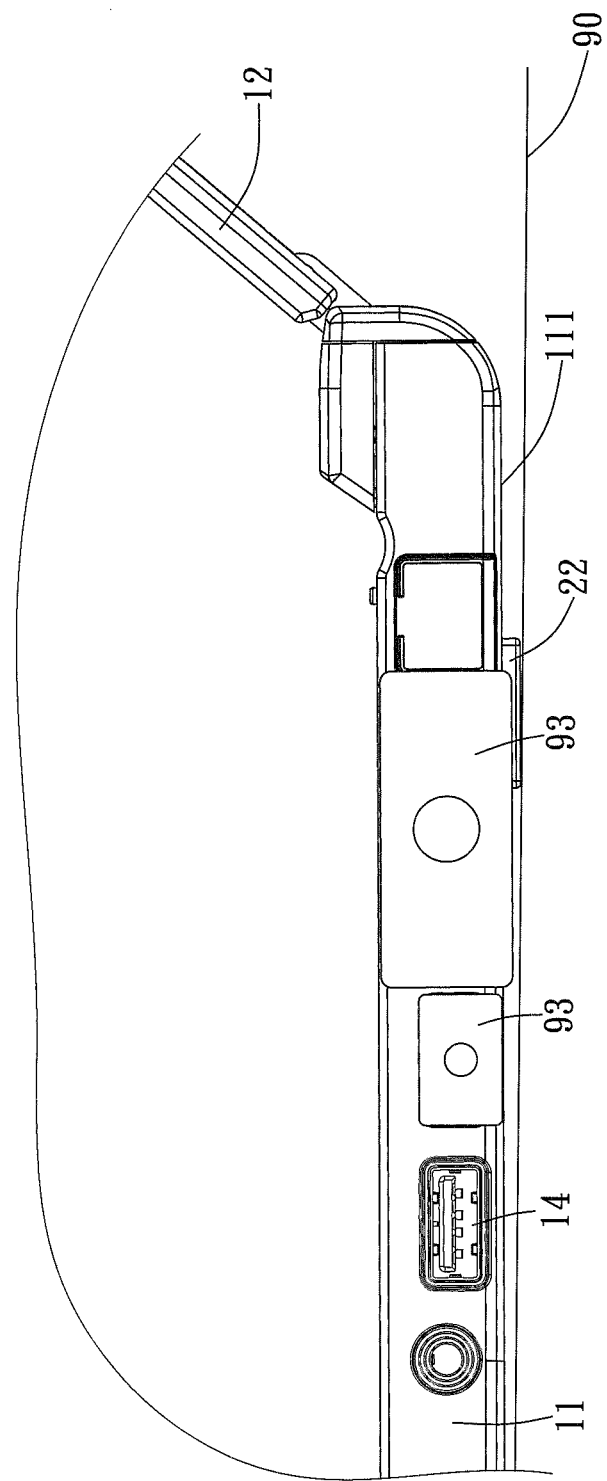
FIG. 10 is a fragmentary schematic side view of the embodiment, illustrating a cover body in an open position.

Referring to FIG. 10, when the cover body 12 is moved to the open position, the foot pad 22 is in the protruding position and protrudes out of the bottom wall 111. In this way, the housing body 11 may be raised to increase the distance between a plurality of socket connectors 14 that are disposed on side edges of the housing body 11 and the desktop 90. Thus, plug connectors 93 to be inserted into the respective socket connectors 14 will not be interfered by the desktop 90, there by facilitating insertion and removal of the plug connectors 93 by the user.

To sum up, since the foot pads 22 can be moved from the retracted position to the protruding position as the cover body 12 is opened pivotally, the distance between the socket connectors 14 and the desktop 90 can be increased, thereby facilitating the user to insert or remove the plug connectors 93 to or from the respective socket connectors 14. In addition, the cover body 12 can also be positioned at a desired pivot angle, thereby facilitating the user to view the display screen. Thus, the objects of the present invention can be achieved.

While the present invention has been described in connection with what is considered the most practical embodiment, it is understood that this invention is not limited to the disclosed embodiment but is intended to and scope of the broadest interpretation so as to encompass all such modifications and equivalent arrangements.

The invention claimed is:

1. A portable electronic device, comprising:
a housing having a housing body, a cover body and a pair of hinges, said pair of hinges interconnecting said housing body and said cover body so that said cover body is pivotable relative to said housing body between a closed position and an open position, said housing body having a bottom wall and a pair of grooves formed in said bottom wall, each of said pair of grooves being spaced apart from a respective one of said hinges by a definite distance;
a pair of foot modules disposed on said bottom wall and respectively corresponding to positions of said pair of grooves, each of said foot modules including a hollow limiting member and a foot pad, an inner portion of said limiting member being in spatial communication with a respective one of said grooves, said foot pad being movably disposed in said limiting member and said respective groove, and being movable between a retracted position, where said foot pad is disposed in said limiting member and said respective groove, and a protruding position, where said foot pad partially protrudes out of said respective groove; and
a pair of cam mechanisms, each of said cam mechanisms being connected to one of said hinges and body is pivoted from said closed position to said open position, each of said hinges actuates a respective one of said cam mechanisms which in turn actuates said foot pad of a respective one of said foot modules so as to move said foot pad from said retracted position to said protruding position.

2. The portable electronic device of claim 1, wherein each of said foot modules further comprises a first elastic element disposed in said inner portion of said limiting member and connected to said foot pad, when said cover body is pivoted back to said closed position, said food pad is biased by a restoring force of said first elastic element to move from said protruding position to said retracted position.

3. The portable electronic device of claim 1, wherein each of said cam mechanisms includes a cam connected to the respective one of said hinges, a cam follower disposed on said bottom wall and spanning the respective one of said grooves, and a second elastic element disposed between said housing body and said cam follower, said cam follower being linearly movable in two opposite directions under the action of said cam and said second elastic element, said cam follower having a push portion corresponding in position to said foot pad, when said cover body is pivoted from said closed position to said open to move from said retracted position to said protruding position.

4. The portable electronic device of claim 3, wherein said foot pad of each of said foot modules has a foot pad body and a bottom plate connected to a bottom side of said foot pad body, said foot pad body being formed with a first positioning structure, said push portion of said cam follower being formed with a second positioning structure, said first and second positioning structures cooperating to position said foot pad at said protruding position.

5. The portable electronic device of claim 4, wherein said first positioning structure is provided on a top side of said foot pad body and is configured as an inverted V-shaped protrusion, said second positioning structure including a substantially inverted V-shaped groove to engage releasably said inverted V-shaped protrusion.

6. The portable electronic device of claim 4, wherein said first positioning structure is provided on a top side of said foot pad body and is configured as an inverted V-shaped protrusion, said second positioning structure including a plurality of interconnected substantially inverted V-shaped grooves arranged along a moving direction of said cam follower, said cover body being selectively to said housing body when said inverted V-shaped protrusion is engaged to a selected one of said inverted V-shaped grooves.

7. The portable electronic device of claim 3, wherein each of said foot modules further includes a first elastic element and a limiting rod, said limiting member including a pair of first vertical walls, a pair of vertical guide slots, and a holding portion between said first vertical walls and adjacent to said respective groove, said pair of first vertical walls being oppositely spaced apart from each other and perpendicular to said bottom wall, said vertical guide slots extending inwardly and respectively from top ends of said first vertical walls to receive respectively therein two opposite ends of said limiting rod, so that said limiting rod is movable along a direction perpendicular to said bottom wall, said foot pad further having a through slot formed in said first positioning structure to receive therein a rod body of said limiting rod which is between said two opposite ends of said limiting rod, said bottom plate abutting against said holding portion when said foot pad is in said retracted position, said first elastic element being disposed around said foot pad body of said foot pad and sandwiched between said limiting rod and said to said closed position, said foot pad is biased by a restoring force of said first elastic element to move from said protruding position to said retracted position.

8. The portable electronic device of claim 7, wherein said limiting member further includes a pair of second vertical walls connected between said pair of first vertical walls and cooperating with said pair of first vertical walls to define a surrounding wall, said pair of second vertical walls being spaced apart from each other in a moving direction of said cam follower and being respectively formed with a notch to permit passage of said push portion into or out of said inner portion of said limiting member when said cam follower moves in said moving direction.

9. The portable electronic device of claim 5, wherein said second positioning structure further includes a guide inclined face that is slidable on said first positioning structure.

10. The portable electronic device of claim 3, wherein said housing body further has two fixing studs connected to said bottom wall and disposed on two opposite sides of a corresponding one of said grooves, said cam follower further having an elongated body and a pair of elongated slide slots formed in said respective foot module, said pair of elongated slide slots being respectively located at two opposite sides of said push portion and extending along a moving direction of said cam follower to receive respectively said fixing studs to mount said cam follower on said bottom wall.

* * * * *